(12) United States Patent
Das et al.

(10) Patent No.: US 12,537,518 B1
(45) Date of Patent: Jan. 27, 2026

(54) CONFIGURABLE DELAY CHAIN

(71) Applicant: Synopsys, Inc., Sunnyvale, CA (US)

(72) Inventors: Abhishek Das, Bangalore (IN); Amnon Parnass, Kadima-Zoran (IL); Durga Prasad Bade, Bangalore (IN); Shubharthi Datta, San Jose, CA (US); O M Syed Ali, Bangalore (IN)

(73) Assignee: Synopsys, Inc., Sunnyvale, CA (US)

( * ) Notice: Subject to any disclaimer, the term of this patent is extended or adjusted under 35 U.S.C. 154(b) by 50 days.

(21) Appl. No.: 18/582,941

(22) Filed: Feb. 21, 2024

(51) Int. Cl.
| | |
|---|---|
| *H03K 5/133* | (2014.01) |
| *G01R 31/3185* | (2006.01) |
| *H03K 5/00* | (2006.01) |
| *H03K 19/20* | (2006.01) |

(52) U.S. Cl.
CPC ..... *H03K 5/133* (2013.01); *G01R 31/318536* (2013.01); *H03K 19/20* (2013.01); *H03K 2005/00019* (2013.01)

(58) Field of Classification Search
CPC ............... H03K 5/133; H03K 19/20; H03K 2005/00019; G01R 31/318536
See application file for complete search history.

(56) References Cited

U.S. PATENT DOCUMENTS

| | | | | |
|---|---|---|---|---|
| 5,430,394 | A * | 7/1995 | McMinn | H03K 5/133 327/276 |
| 7,644,385 | B1 * | 1/2010 | Boyle | H03K 5/133 326/38 |
| 10,075,166 | B2 * | 9/2018 | Martinez | H03K 19/20 |
| 2008/0129342 | A1 | 6/2008 | Masleid | |

FOREIGN PATENT DOCUMENTS

WO     WO-2012082140 A1 *  6/2012  ............... H03K 5/14

\* cited by examiner

*Primary Examiner* — Lincoln D Donovan
*Assistant Examiner* — James G Yeaman
(74) *Attorney, Agent, or Firm* — Fenwick & West LLP

(57) ABSTRACT

An integrated circuit includes a configurable delay chain, which contains a chain of binary delay blocks. Each binary delay block includes the following. Inputs receive an input signal, a select signal and a test control signal. A delay branch transmits the input signal with a delay, and a bypass branch transmits the input signal without the delay. Selector circuitry is connected to the delay branch and to the bypass branch. The selector circuitry selects either the delay branch or the bypass branch according to the select signal. According to the test control signal, test circuitry produces a test signal to test the selector circuitry.

15 Claims, 9 Drawing Sheets

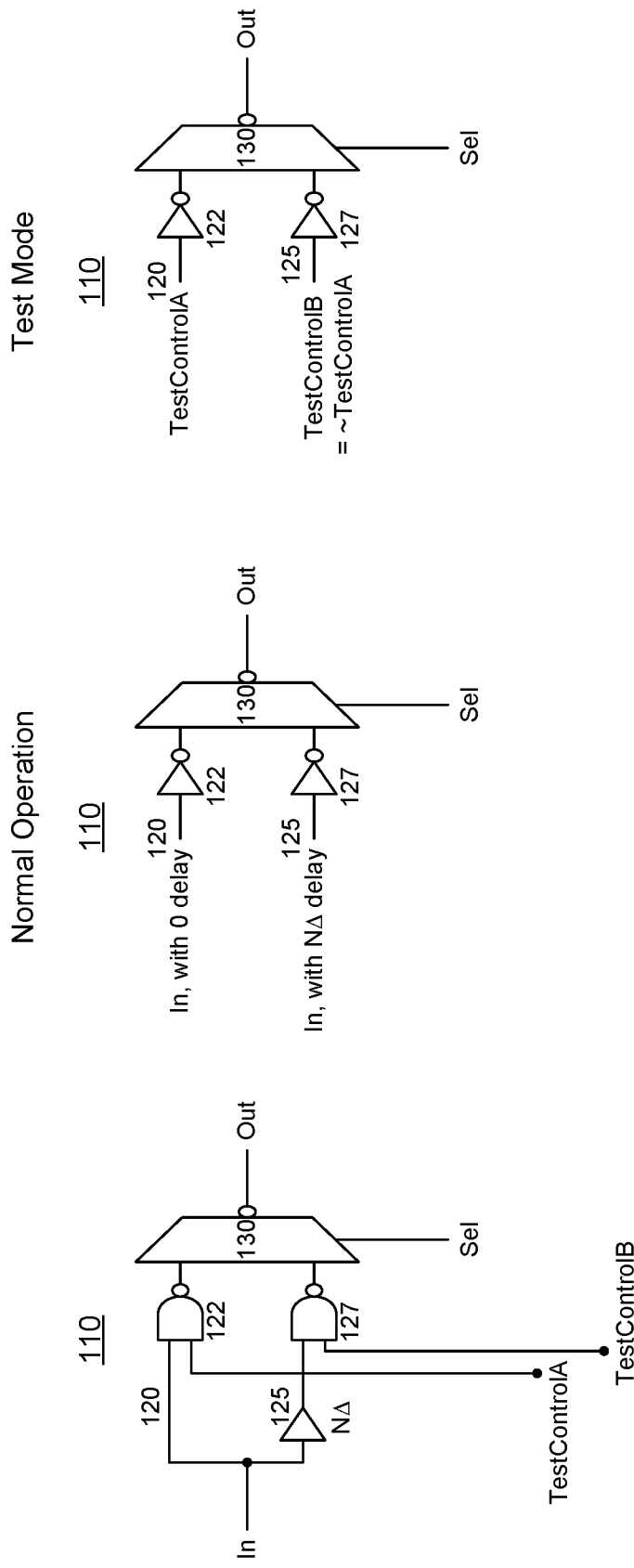

CONFIGURABLE DELAY CHAIN

TECHNICAL FIELD

The present disclosure relates to an electronic circuit. In particular, the present disclosure relates to configurable delay chains.

BACKGROUND

A delay circuit intentionally introduces delay in the propagation of a signal. Delay circuits are used for various purposes. For example, delays may be added during the design of integrated circuits in order to meet timing requirements. If one signal path is too fast or too slow relative to another signal path, delays may be added to the faster signal path in order to address any timing violations caused by the mismatch.

Fixed delay circuits introduce a fixed amount of delay. In the timing example, a certain amount of fixed delay may be sufficient to address the timing violation.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

FIG. 1A is a circuit schematic of a binary delay block, in accordance with some embodiments of the present disclosure.

FIG. 1B illustrates normal operation of the binary delay block of FIG. 1A, in accordance with some embodiments of the present disclosure.

FIG. 1C illustrates a test mode of the binary delay block of FIG. 1A, in accordance with some embodiments of the present disclosure.

DETAILED DESCRIPTION

Figure 1D:
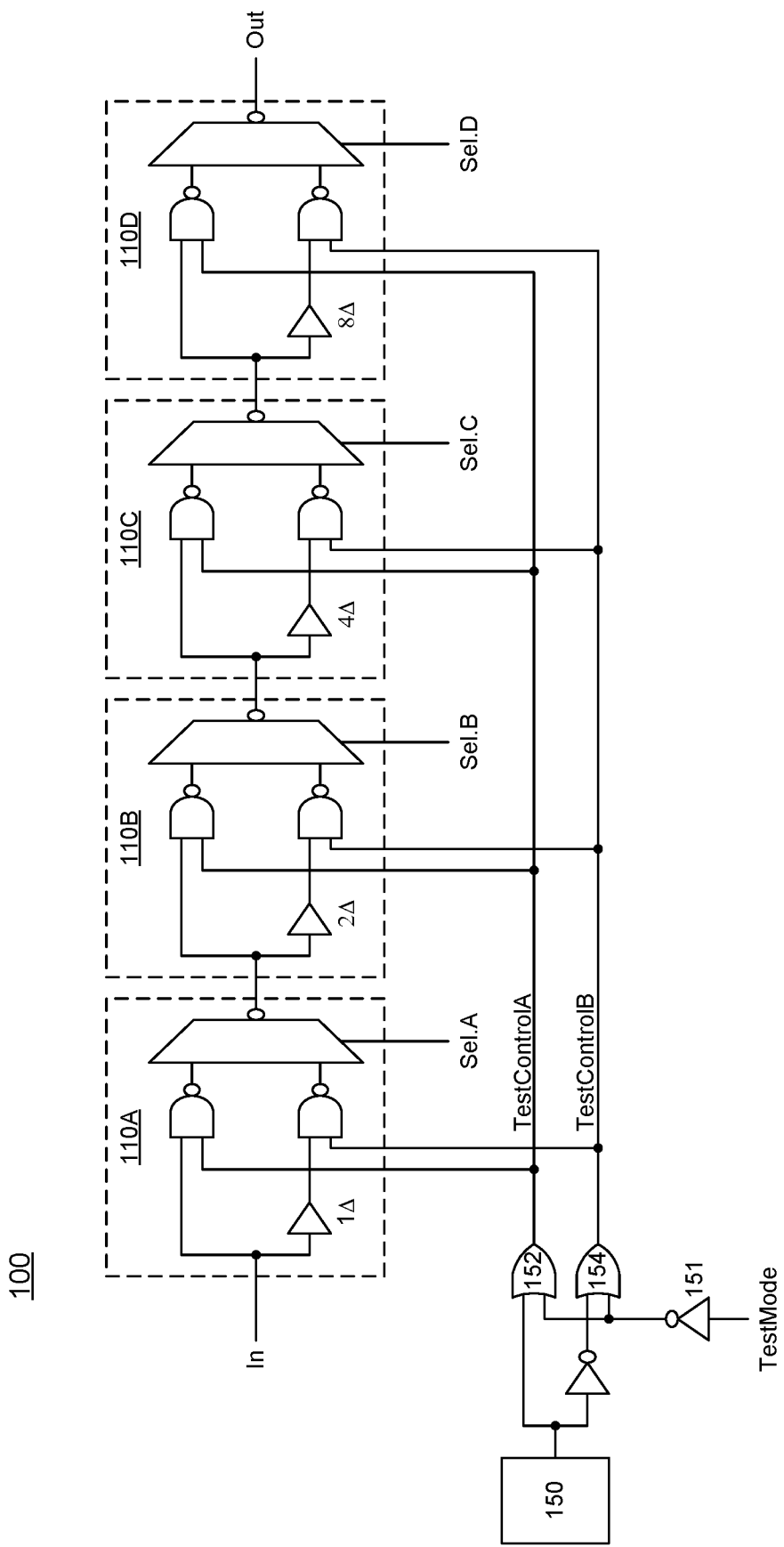
FIG. 1D is a circuit schematic of a configurable delay chain constructed using the binary delay blocks of FIG. 1A, in accordance with some embodiments of the present disclosure.

Aspects of the present disclosure relate to configurable delay chains. A configurable delay chain is a type of configurable delay circuit that uses a chain of delay blocks. Each delay block may add some delay, and the overall delay is the sum of the delays added by each of the delay blocks. The delay chain is configurable if the overall delay can be adjusted, for example by changing the amount of delay introduced by different delay blocks and/or by changing which delay blocks are included as part of the chain. As integrated circuits become more complex, there is a need for better delay circuits, including better configurable delay chains.

Configurable delay chains have many uses. For example, delay chains can be used in ring oscillators. The frequency of the ring oscillator depends on the delay introduced by the delay chain. If the delay is adjustable, as in a configurable delay chain, then the frequency of the ring oscillator will also be adjustable. As another example, delay chains can be used for timing purposes in integrated circuits. They can be used to delay propagating signals. They can also be used to monitor the propagation delay across a signal path. Delays chains can also be used in other types of monitors. For example, the delay may change as a function of temperature. Based on this effect, delay chains can be used in temperature monitors. As a final example, delay chains can be used to generate pseudo random patterns in physically unclonable functions (PUF) circuits. Adding configurability to the delay chain provides additional flexibility to these applications.

In some aspects, a configurable delay chain is constructed from a chain of binary delay blocks. The delay blocks are binary in the sense that each delay block introduces one of two possible delays. In one approach, the two possible delays are some delay and no delay. The some delay may be binary weighted across the delay blocks. One delay block introduces a delay of either 1Δ or 0, a second delay block introduces either 2Δ or 0, a third delay block introduces either 4Δ or 0, etc. Each delay block includes a delay branch that introduces the NΔ delay and a bypass branch that introduces the 0 delay. If the delay blocks are chained in order, then the delay branch of each delay block introduces twice the delay of the previous delay block. A select signal determines which branch is used, and selector circuitry in the delay block implements the selection.

It is desirable to be able to test circuitry. This includes testing the selector circuitry. However, the selector circuitry produces either a signal with NΔ delay or the same signal with 0 delay. These are two versions of the same input signal, just with different delays. Since the values of these two versions are the same, but just time shifted, it can be difficult to detect faults in the selector circuitry. If the selector circuitry is not operating correctly, it might output a signal with delay 0 when it should output the same signal with delay NΔ. It can be difficult to detect this timing difference. Accordingly, the delay block also includes test circuitry that causes the delay branch and the bypass branch to produce signals of different values for testing purposes. If the selector circuitry is faulty, it might then output a signal with logic value 0 when it should output a signal with logic value 1. This difference is easier to detect using a design-for-test (DFT) testing system and may be implemented as part of the chip testing using scan chains.

In yet another aspect, the physical layout of the configurable delay chain can be made modular and compact. The delay blocks may be constructed using library circuit cells. Library circuit cells may have a common height H. In one approach, the delay blocks are physically laid out as a stack where each delay block has a height of 2H. The delay blocks connect to each other along a central column. The 2H height provides two rows of height H. This is enough area to construct a loop of delay elements (i.e., the delay branch) positioned to the side of the central column for each delay block. The loop extends away from the central column along one row and then returns along the other row. The length of the loop depends on the number of delay elements (e.g. buffers or inverters) for that delay block. In this modular architecture, the configurable delay chain may be extended by adding more delay blocks to the stack.

Technical advantages of the present disclosure may include, but are not limited to, the following. It can have relatively high testability (e.g., 100% testability), meaning that all logic including the selector circuitry can be tested. The physical layout described is relatively compact and uses a small amount of area and can have good power, performance, area (PPA) metrics as a result. It is also modular and scalable, allowing for straightforward extension of the delay chain. In some cases, the layout can be generated programmatically, for example by scripts. The physical layout also facilitates balancing of the bypass branch and delay branch, so that each branch has the same propagation delay, excluding the intentional delay introduced by the delay branch. Well-balanced branches are important to achieve high resolution delay chains (i.e., delay chains with short Δ).

FIG. 1A is a circuit schematic of a binary delay block, in accordance with some embodiments of the present disclosure. The delay block 110 of FIG. 1A receives an input signal In, test control signal TestControlA/B and a selection signal Sel. It produces output signal Out. In this example, these are all single bit signals. The delay block includes a bypass branch 120 and a delay branch 125. The delay branch 125 includes N delay elements connected in series, as indicated by the notation NΔ in FIG. 1A. If the delay chain is binary weighted, then N will be a power of 2. The bypass branch does not include any delay elements. The two branches are input to a selector circuit, which in this example is a 2:1 multiplexer 130. Depending on the Sel signal, either the delay branch 125 or the bypass branch 120 is passed to the output signal Out. For purposes of balancing the two branches, the propagation delay through the two branches should be the same, other than the NΔ difference. NAND gates 122,127 are test circuitry added to facilitate testing of the multiplexer 130.

FIG. 1B shows normal operation of the binary delay block. During normal operation, TestControlA and B are set to logic 1, so the NAND gates 122,127 act as pass-throughs for the bypass branch 120 and delay branch 125. Strictly speaking, in this implementation, the NAND gates 122,127 also invert the incoming signal so they operate as inverters, and the multiplexer 130 adds another inversion to reverse the inverters. During normal operation, both branches 120, 125 receive the input signal. For the delay branch 125, the input signal is delayed by NΔ. For the bypass branch 120, the input signal is delayed by 0. These two signals are passed through the NAND gates 122,127, which are acting as inverters. The 2:1 multiplexer 130 select which version of the input signal to pass to Out.

Now consider testing of the selector circuitry 130. If there is a fault in the selector circuitry, then the bypass branch may be selected when the delay branch should be selected. However, this fault is difficult to detect during normal operation because both branches produce the same signal In, albeit with different delays. FIG. 1C is a simplified diagram showing a test mode for the binary delay block. In test mode, the input signal In is logic 1 so that the NAND gates 122,127 act as pass-throughs (inverters) for TestControlA and B. In addition, as explained below, TestControlA and B have different logic values. When TestControlA is logic 1, then TestControlB is logic 0, and vice versa. In FIG. 1C, this is indicated by labeling TestControlB as the inverse (~) of TestControlA. Now if there is a fault in the selector circuitry 130, the output signal Out will have the wrong value, which is an easier fault to detect.

FIG. 1D is a circuit schematic of a configurable delay chain constructed using these delay blocks. The configurable delay chain 100 includes a number of delay blocks 110A-D connected in a chain. The output Out of each delay block 110 is connected to the input In of the next delay block in the chain. The delays for each delay block 110 increase by powers of 2. Delay block 110A has a delay of 1Δ and delay blocks 110B-D have delays of 2Δ, 4Δ, and 8Δ, respectively. The signals Sel.A-D determine whether the delay branch or bypass branch is selected for each delay block. As a result, the delay chain 100 can introduce a delay that varies from 0Δ to 15Δ.

Now consider testing of the delay chain 100. Scan chains are one approach used to test circuitry. Scan chains are chains of registers, sometimes referred to as scan flops, that are used to apply test patterns to circuitry. The circuitry shown in FIG. 1D also includes a recirculate scan flop 150 that is used to test the delay chain 100 and specifically to test whether the selector circuitry is operating properly. The signal TestMode determines whether the circuit is in test mode.

If TestMode is logic 0, then the circuit is in normal operation. The inverter 151 changes the logic 0 to logic 1 for one input of each OR gate 152,154. The outputs TestControlA and TestControlB of the OR gates 152,154 are then logic 1, as described in FIG. 1B for normal operation.

If TestMode is logic 1, then one input to each OR gate 152,154 is logic 0, and the OR gates act as pass-throughs. The bit stored in the scan flop 150 is passed through to TestControlA and is inverted for TestControlB. The Input to the delay block is set to logic 1 so that the NAND gates 122,127 pass the TestControl values. The inputs to the multiplexer now receive signals of different values. When TestControlA is logic 1, then TestControlB is logic 0, and vice versa, as described in FIG. 1C for test mode.

Figure 2:
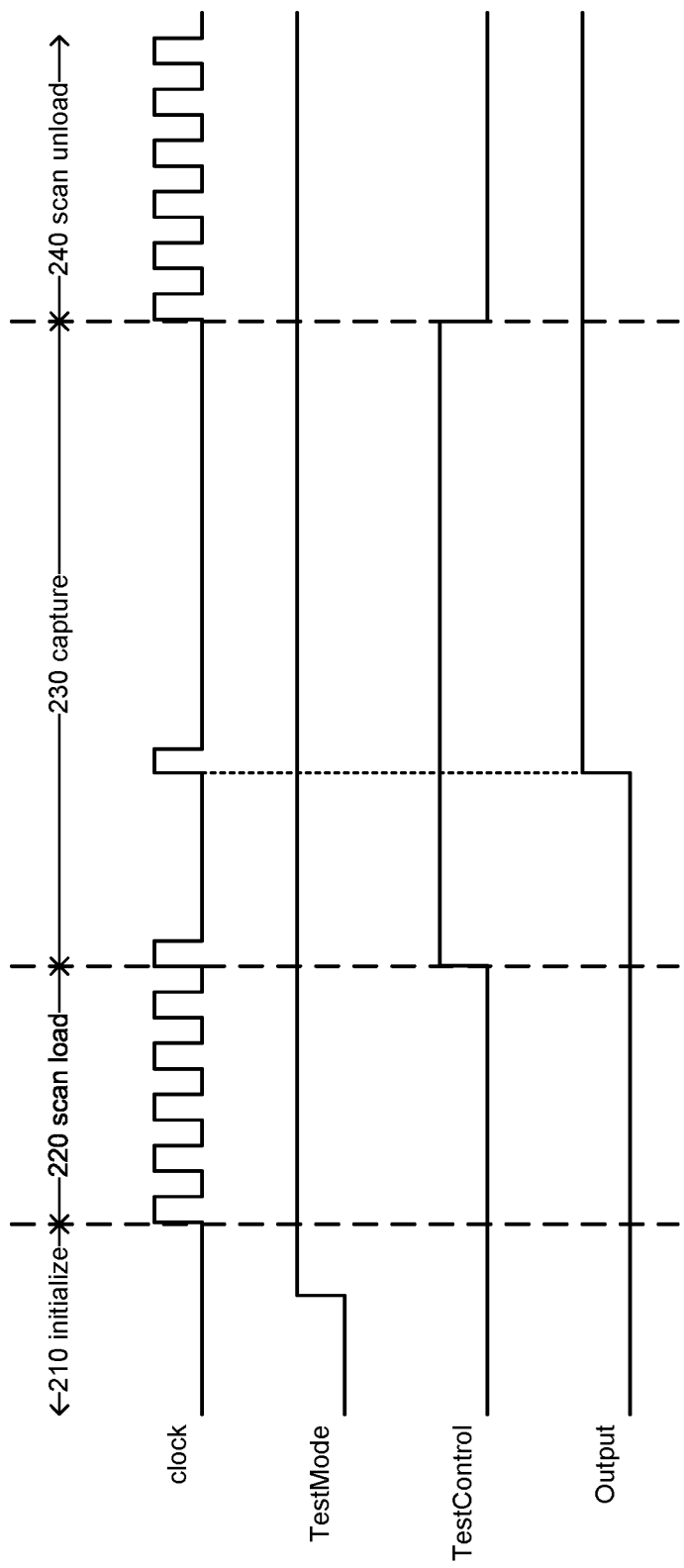
FIG. 2 is a timing diagram for testing selector circuitry, in accordance with some embodiments of the present disclosure.

FIG. 2 is a timing diagram that illustrates this testing. At 210 (initialization), TestMode is asserted, placing the circuit into test mode. At 220, test patterns are scanned into scan flops, including the values in scan flop 150. At 230, the test patterns are exercised and resulting outputs are captured. TestControlA is set to logic 1 so TestControlB is set to logic 0. If Select is set to select TestControlB, then the multiplexer 130 should output logic 0. However, if there is a stuck-at fault, then the multiplexer 130 will output logic 1. At 240, the captured output is scanned out for review.

FIG. 2 is a timing diagram for testing one delay block. The delay blocks may be tested concurrently if the inputs and outputs of each delay block are accessible through the scan chain. The single scan flop 150 may be used to test all of the delay blocks in parallel. The scan flop 150 may be set to logic 1 (TestControlA equals logic 1) to test one selection function of the multiplexer 130, and it may be set to logic 0 (TestControlB equals logic 1) to test the other selection function.

Alternatively, the delay blocks may be tested one at a time. In this approach, if there are N delay blocks in the chain, then 2N patterns are used to test the selection logic. These faults can be merged with the testing of other parts of the circuit so it will not introduce extra testing time.

Figure 3:
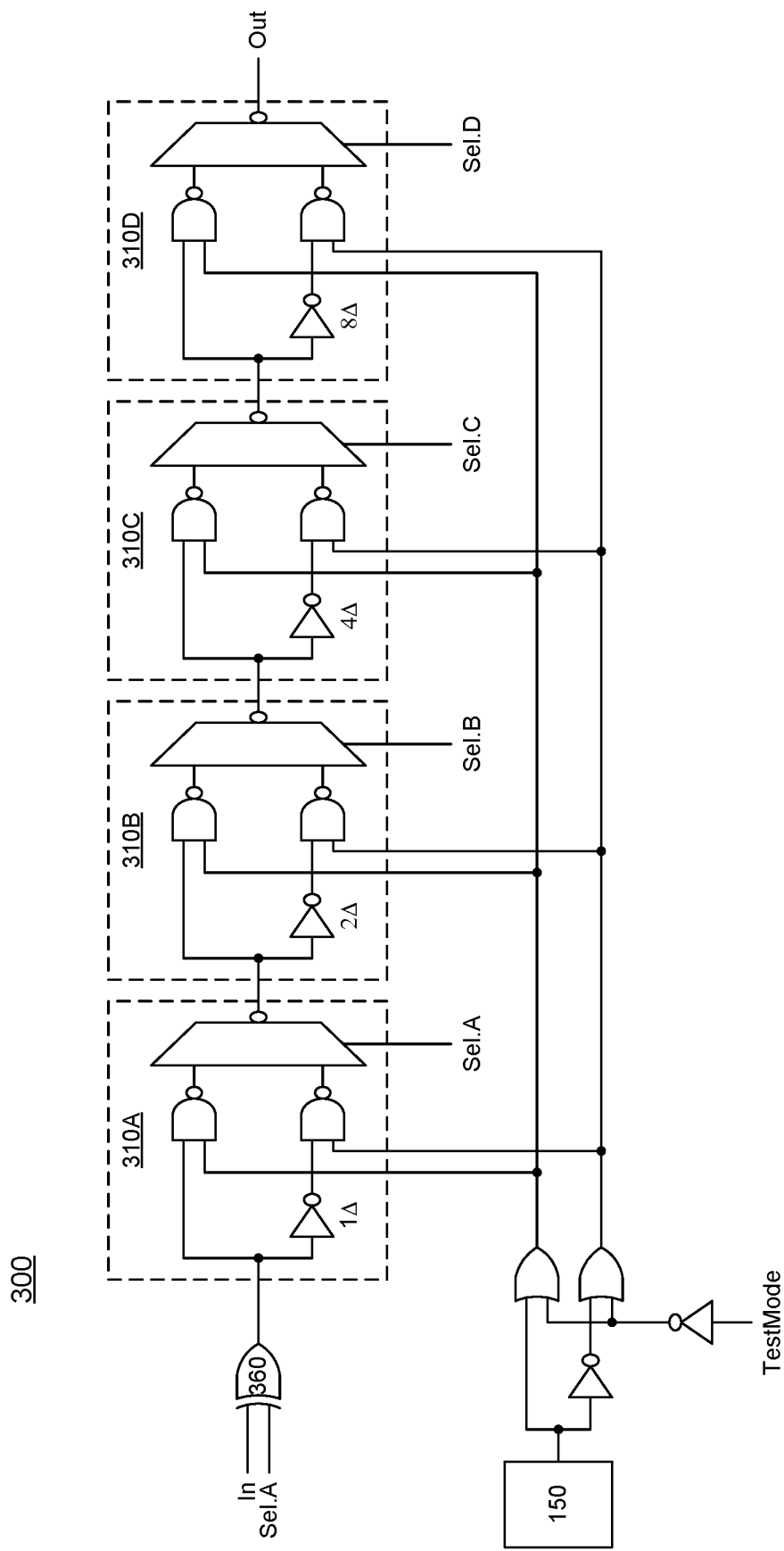
FIG. 3 is a circuit schematic of another configurable delay chain, in accordance with some embodiments of the present disclosure.

FIG. 3 is a circuit schematic of another configurable delay chain. In this example, the delay elements are inverters, rather than buffers as in FIGS. 1A-1B. To accommodate the single inverter in delay block 310A, an XOR gate 360 is added, taking In and Sel.A as its two inputs. The XOR gate 360 balances the polarity of the delay chain output. The use of inverters can provide greater flexibility in choosing the delay element, because inverters may have less delay than buffers, which can be used to provide more granularity in setting the delay.

Figure 4:
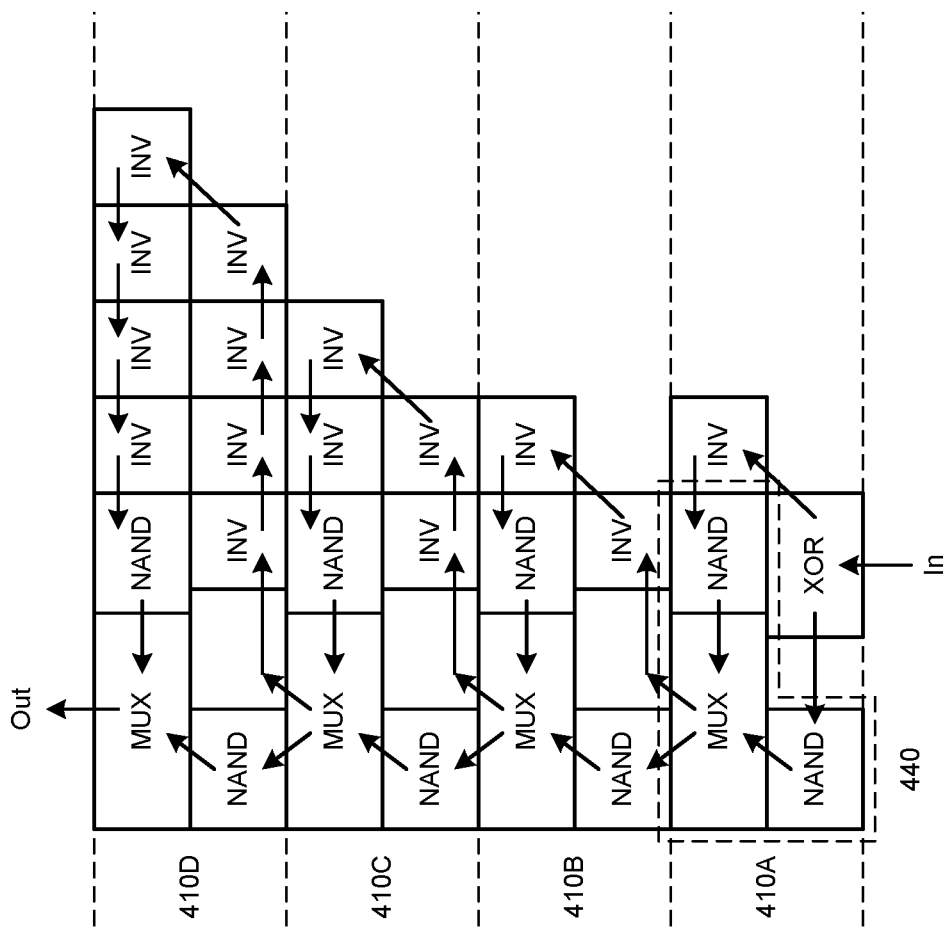
FIG. 4 is a floorplan of a configurable delay chain, in accordance with some embodiments of the present disclosure.

FIG. 4 is a floorplan of a configurable delay chain, in accordance with some embodiments of the present disclosure. The floorplan shows the physical layout of the delay chain for the inverter-based design of FIG. 3. The delay blocks are constructed using library circuit cells: MUX (2:1 inverting multiplexer), NAND and INV (inverters). The standard cells are all the same height and they are laid out in rows. Each delay block 410A-D occupies two rows, as shown by the dashed lines. The delay blocks 410A-D in FIG. 4 show the physical layout of delay blocks 310A-D in FIG. 3. The arrows show the data flow between cells. This data flow is implemented by interconnects between the cells.

The floorplan is modular and relatively compact. The binary delay blocks are physically laid out as a "stack" of delay blocks 410A-D. The delay block 410A with 1 inverter is at one end of the stack. Delay block 410B with 2 inverters is stacked adjacent to delay block 410A, delay block 410C with 4 inverters is stacked adjacent to delay block 410B, and so on. Four delay blocks are shown in FIG. 4, but the configurable delay chain may be extended by stacking more delay blocks. Each delay block occupies two rows. Each delay block may be divided into two parts: header circuitry 440 that includes the MUX and the two NAND gates, and the series of delay elements INV. The header circuitry 440 is the same for each delay block and the header circuitries are stacked adjacent to each other to form a column. This facilitates connection between the delay blocks.

The delay branch for each delay block has a different number of inverters. These delay elements are physically laid out as a loop that extends from the header circuitry along the bottom of the two rows and returns back to the header circuitry along the top of the two rows. The length of the loop will vary depending on the number of delay elements. Thus, the configurable delay chain may be extended by adding additional delay blocks along the vertical direction, and each delay block has delay elements that are laid out along the orthogonal horizontal direction.

Another advantage of this floorplan is that the bypass branch and the delay branch are balanced. The bypass branch in a delay block flows through the NAND gate in the bottom row to the MUX. The delay branch flows through the series of INVs, through the NAND gate in the top row and to the MUX. As a result of this regular layout, these two branches can be designed to have the same propagation delay, excluding the delay added by the INVs.

As a result of the modularity of this design, it can be provided in different ways to designers. For example, the header circuitry may be provided as a pre-designed IP block. The designer then adds the series of inverters for each delay block. Alternatively, the delay blocks may be provided as pre-designed IP blocks. In yet another approach, a compiler or software algorithm may automatically generate the configurable delay chain. The designer may provide parameters including the number of delay blocks or the resolution of the delay chain. The compiler then generates the IP block based on these parameters.

The configurable delay chains described above may be used in many different applications. One example is shown in FIG. 5. FIG. 5 is a block diagram of a path margin monitoring unit (PMU) using a configurable delay chain, in accordance with some embodiments of the present disclosure.

Figure 5A:
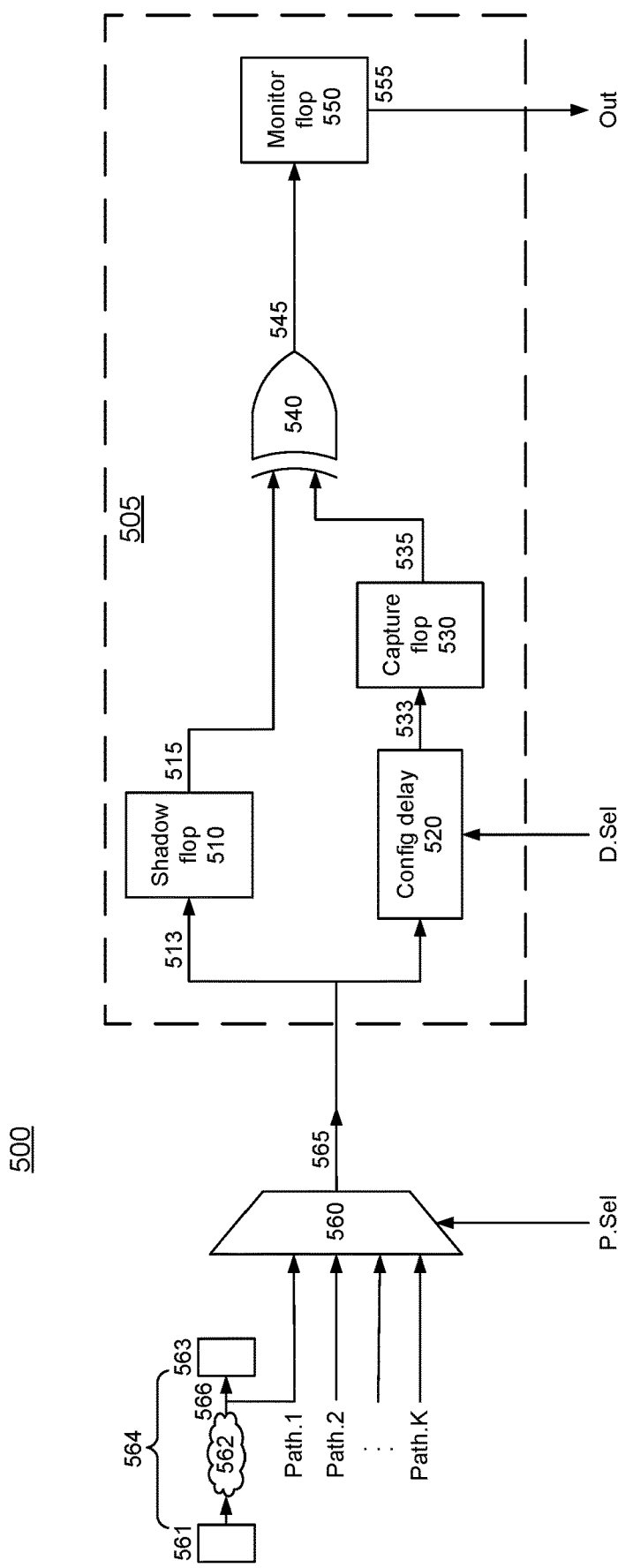
FIG. 5A is a block diagram of a path margin monitoring unit (PMU) using a configurable delay chain, in accordance with some embodiments of the present disclosure.

FIG. 5A is a block diagram of a path margin monitoring unit (PMU) 500, in accordance with some embodiments of the present disclosure. In digital circuits, signals propagate between sequential circuits, such as flip flops and registers, according to timing determined by clocks. In order for digital circuits to function properly, these signals must arrive at the next sequential circuit at least a certain amount of time before the relevant clock signal. The difference between when the signal arrives and the latest time when it could arrive is referred to as the timing margin or path margin or simply margin. Instances of the PMU 500 may be distributed throughout an integrated circuit in order to monitor path margin at different points across the integrated circuit in real-time.

Figure 5B:
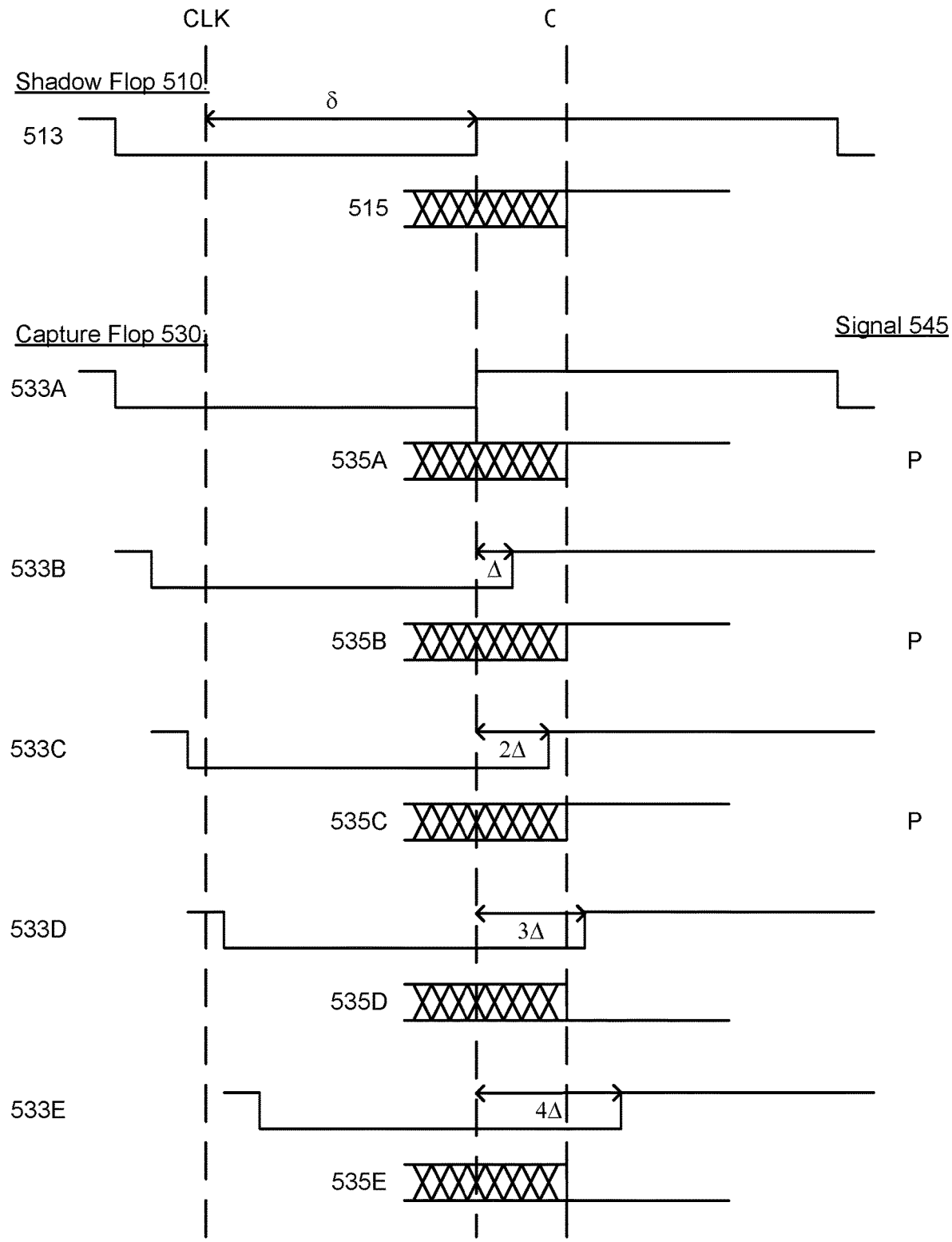
FIG. 5B is a timing diagram showing operation of the path monitor circuitry of FIG. 5A.

FIG. 5A illustrates operation of the path monitor circuitry 505 within the PMU. FIG. 5B is a timing diagram showing operation of the path monitor circuitry 505. FIG. 5A shows a signal path 564 that is monitored by PMU 500. The signal path 564 originates at sequential circuit 561, propagates through combinational circuitry 562 and terminates at sequential circuit 563. In this example, the sequential circuits 561, 563 are flip flops (also referred to as flops herein), and the originating flop 561 and terminal flop 563 are both clocked by a common clock signal. This example shows one originating flop 561 for clarity, but there may be multiple originating flops to produce the functional signal received by the terminal flop 563.

The signal path 564 is tapped at point 566 and the PMU 500 monitors the delay of the signal at this point. This signal is one of the inputs to multiplexer 560 and is labeled Path.1 in FIG. 5A. P.Sel (path select) is the select signal for the multiplexer, which may be provided by a PMU controller. When the multiplexer 560 is set to select Path. 1, the monitored signal 566 is selected and routed to the multiplexer output 565. The path monitor circuitry 505 monitors the delay of this signal. The path monitor circuitry 505 receives the signals propagating along the Path. 1 being monitored and also receives the corresponding clock signal. The monitored signal is compared to delayed versions of the signal to determine the amount of delay that will result in a mismatch between the monitored signal and the respective delayed version of the signal. The amount of delay is a measure of the path margin for that signal path. The path monitor circuitry 505 outputs a monitor signal 555 that is indicative of the path margin and/or delay along the signal path 564.

The path monitor circuitry 505 includes two flip flops 510, 530, both of which are clocked by the same clock signal as flip flop 563. For convenience, they are referred to as the shadow flop 510 and the capture flop 530. Shadow flop 510 receives the monitored signal 565 without additional delay. Capture flop 530 receives a delayed version of the monitored signal 565. Here, the monitored signal 565 is input to a configurable delay circuit 520, which adds an adjustable amount of delay.

The configurable delay circuit 520 may be any of the configurable delay chains described herein. For example, the configurable delay chain 100 of FIG. 1D may be connected as follows. In and Out in FIG. 1D correspond to the input and output of the configurable delay circuit 520 in FIG. 5A. Sel.A-Sel.D in FIG. 1D correspond to D.Sel in FIG. 5A. For clarity, the test control signals of FIG. 1D are omitted in FIG. 5A.

In FIG. 5A, the delay select signal D.Sel determines the amount of delay, which in this example is multiples of some base delay Δ. The D.Sel signal may be determined by the PMU controller, either directly or indirectly. For example, the controller may set the operating mode of the PMU 500, which then determines the sequence of P.Sel values applied over time. Alternatively, the controller may send P.Sel signals directly to the PMU.

A comparator 540 (e.g., XOR or XNOR) compares the reference version 515 from the shadow flop 510 and the delayed version 535 from the capture flop 530. The output is indicated as either a pass (P) if the two versions 515 and 535 are the same, or a fail (F) if the two versions 515 and 535 are different. The monitor flop 550 captures the P or F, using the same clock signal as the other flops.

FIG. 5B is a timing diagram illustrating this operation. In this example, the signal path 564 is clocked by clock signal CLK. The monitored signal 565 is toggling between 0 and 1 with some propagation delay δ. The top row of FIG. 5B shows the input 513 to the shadow flop 510, which is just the toggle signal with delay δ. FIG. 5B shows a dashed line at the time point when the CLK signal causes the flops 510, 530 to capture their input values (e.g., at the rising edge of the clock). Shadow flop 510 receives signal 513 and captures a logic 1. It outputs signal 515, which is a reference version of the signal being monitored. For clarity, FIG. 5B considers the value of output signal 515 only after the second CLK trigger.

Below the timing diagrams for the shadow flop 510 are shown five delayed versions 533A-E input to the capture flop 530, with delays ranging from 0 for 535A to 4Δ for 535E. Here, Δ is the base delay of the configurable delay circuit 520. The base delay depends on the technology node. For example, at more advanced nodes, the base delay may be about 15 ps. The timing of the flops 510, 530 is determined by the CLK signal.

Version 533A has zero delay and capture flop 530 would also capture a logic 1 as output 535A, if the configurable delay were set to this delay. Versions 533B,C have increasing delay but the logic 1 value still arrives in sufficient time to be captured by flop 530, resulting in output signals 535B,C. In versions 533D,E, the delay exceeds the available path margin so capture flop 530 would capture the next bit instead, which is the output signal 535D,E of logic 0.

The corresponding output 545 of the comparator 540 is shown in the right column. P stands for pass, meaning that the signal path has sufficient path margin to continue to operate correctly even with the additional time delay. F stands for fail, meaning that the path margin is not sufficient to accommodate the additional delay. In this example, the comparator 540 is an XOR gate. The XOR gate produces a logic 0 when the two inputs are the same, which in this case is a pass P. An XOR output of logic 1 means that the two inputs are different, which is a fail F. Versions 533A-C pass and versions 533D-E fail. From this, it can be deduced that the actual path margin is between 5Δ and 3Δ.

In the example circuit shown in FIG. 5A, not all of the delayed versions 533A-E are compared on every clock cycle. Rather, on each clock cycle, only one delayed version is produced by the configurable delay 520. Other delayed versions are compared on other clock cycles. In an alternative version, multiple values could be compared on a single clock cycle if additional flops were added to capture the different versions. However, this adds area to the PMU, which would be multiplied by the number of PMUs on the integrated circuit.

The explanation thus far concerns the monitoring of a single signal path 564 by a single PMU. Multiplexer 560 allows multiple signal paths to be monitored by a single PMU. In FIG. 5A, there are multiple signal paths Path.1 to Path.K. The select input P.Sel to multiplexer 560 selects which signal is connected to the path monitor circuitry 505.

In some aspects, an integrated circuit includes a configurable delay chain, which contains a chain of binary delay blocks. Each binary delay block includes the following. Inputs receive an input signal, a select signal and a test control signal. A delay branch transmits the input signal with a delay, and a bypass branch transmits the input signal without the delay. Selector circuitry is connected to the delay branch and to the bypass branch. The selector circuitry selects either the delay branch or the bypass branch according to the select signal. According to the test control signal, test circuitry produces a test signal to test the selector circuitry.

Other aspects include components, devices, systems, improvements, methods, processes, applications, computer readable mediums, and other technologies related to any of the above.

Figure 6:
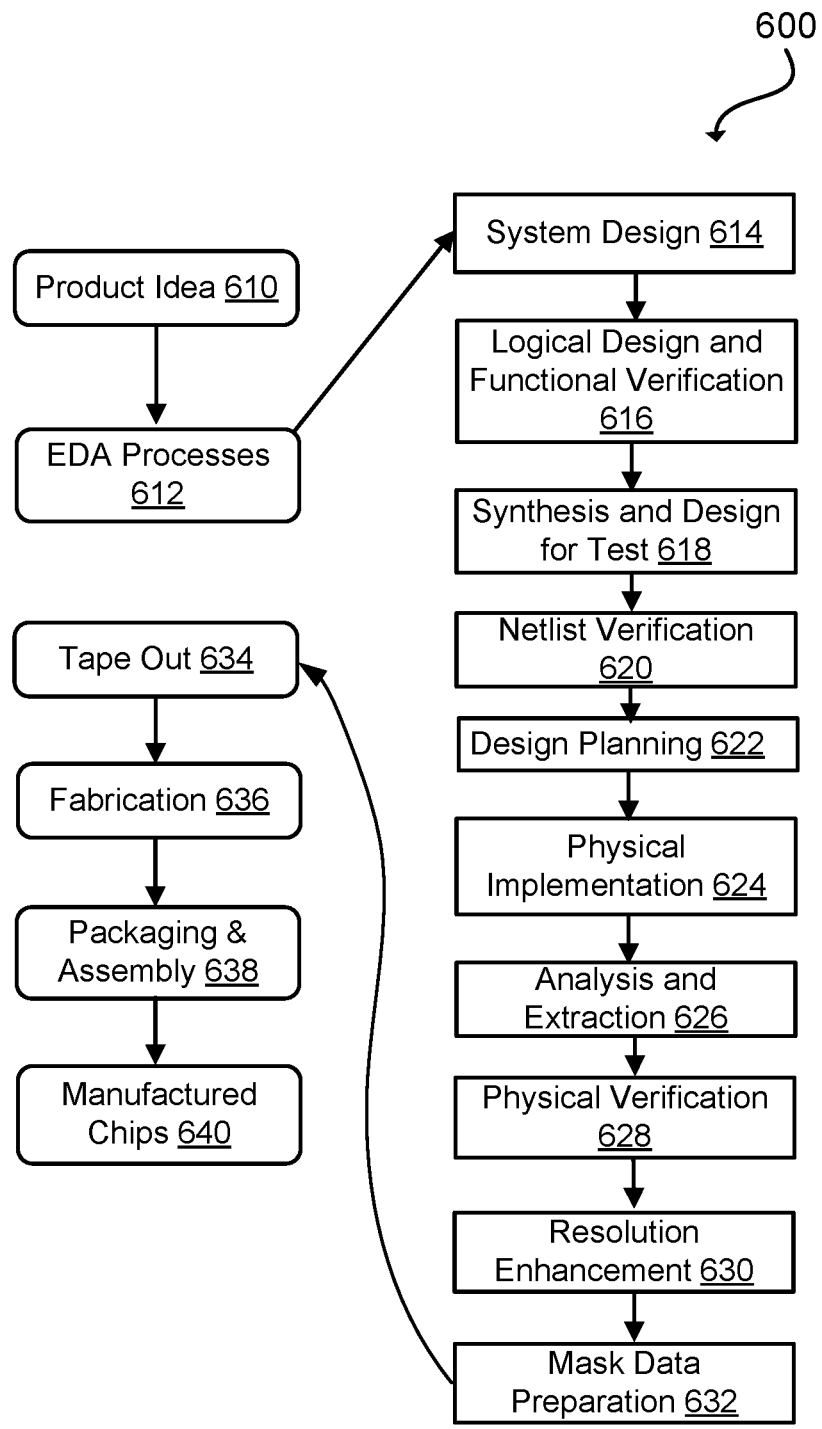
FIG. 6 depicts a flowchart of various processes used during the design and manufacture of an integrated circuit, in accordance with some embodiments of the present disclosure.

FIG. 6 illustrates an example set of processes 600 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 610 with information supplied by a designer, information which is transformed to create an article of manufacture that uses a set of EDA processes 612. When the design is finalized, the design is taped-out 634, which is when artwork (e.g., geometric patterns) for the integrated circuit is sent to a fabrication facility to manufacture the mask set, which is then used to manufacture the integrated circuit. After tape-out, a semiconductor die is fabricated 636 and packaging and assembly processes 638 are performed to produce the finished integrated circuit 640.

Specifications for a circuit or electronic structure may range from low-level transistor material layouts to high-level description languages. A high-level of representation may be used to design circuits and systems, using a hardware description language ('HDL') such as VHDL, Verilog, System Verilog, SystemC, MyHDL or Open Vera. The HDL description can be transformed to a logic-level register transfer level ('RTL') description, a gate-level description, a layout-level description, or a mask-level description. Each lower representation level that is a more detailed description adds more useful detail into the design description, for example, more details for the modules that include the description. The lower levels of representation that are more detailed descriptions can be generated by a computer, derived from a design library, or created by another design automation process. An example of a specification language at a lower level of representation language for specifying more detailed descriptions is SPICE, which is used for detailed descriptions of circuits with many analog components. Descriptions at each level of representation are enabled for use by the corresponding systems of that layer (e.g., a formal verification system). A design process may use a sequence depicted in FIG. 6. The processes described by be enabled by EDA products (or EDA systems).

During system design 614, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 616, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 618, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 620, the netlist is checked for compliance with timing constraints and for correspondence with the HDL code. During design planning 622, an overall floor plan for the integrated circuit is constructed and analyzed for timing and top-level routing.

During layout or physical implementation 624, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 626, the circuit function is verified at the layout level, which permits refinement of the layout design. During physical verification 628, the layout design is checked to ensure that manufacturing constraints are correct, such as DRC constraints, electrical constraints, lithographic constraints, and that circuitry function matches the HDL design specification. During resolution enhancement 630, the geometry of the layout is transformed to improve how the circuit design is manufactured.

During tape-out, data is created to be used (after lithographic enhancements are applied if appropriate) for production of lithography masks. During mask data preparation 632, the 'tape-out' data is used to produce lithography masks that are used to produce finished integrated circuits.

A storage subsystem of a computer system (such as computer system 700 of FIG. 7) may be used to store the programs and data structures that are used by some or all of the EDA products described herein, and products used for development of cells for the library and for physical and logical design that use the library.

Figure 7:
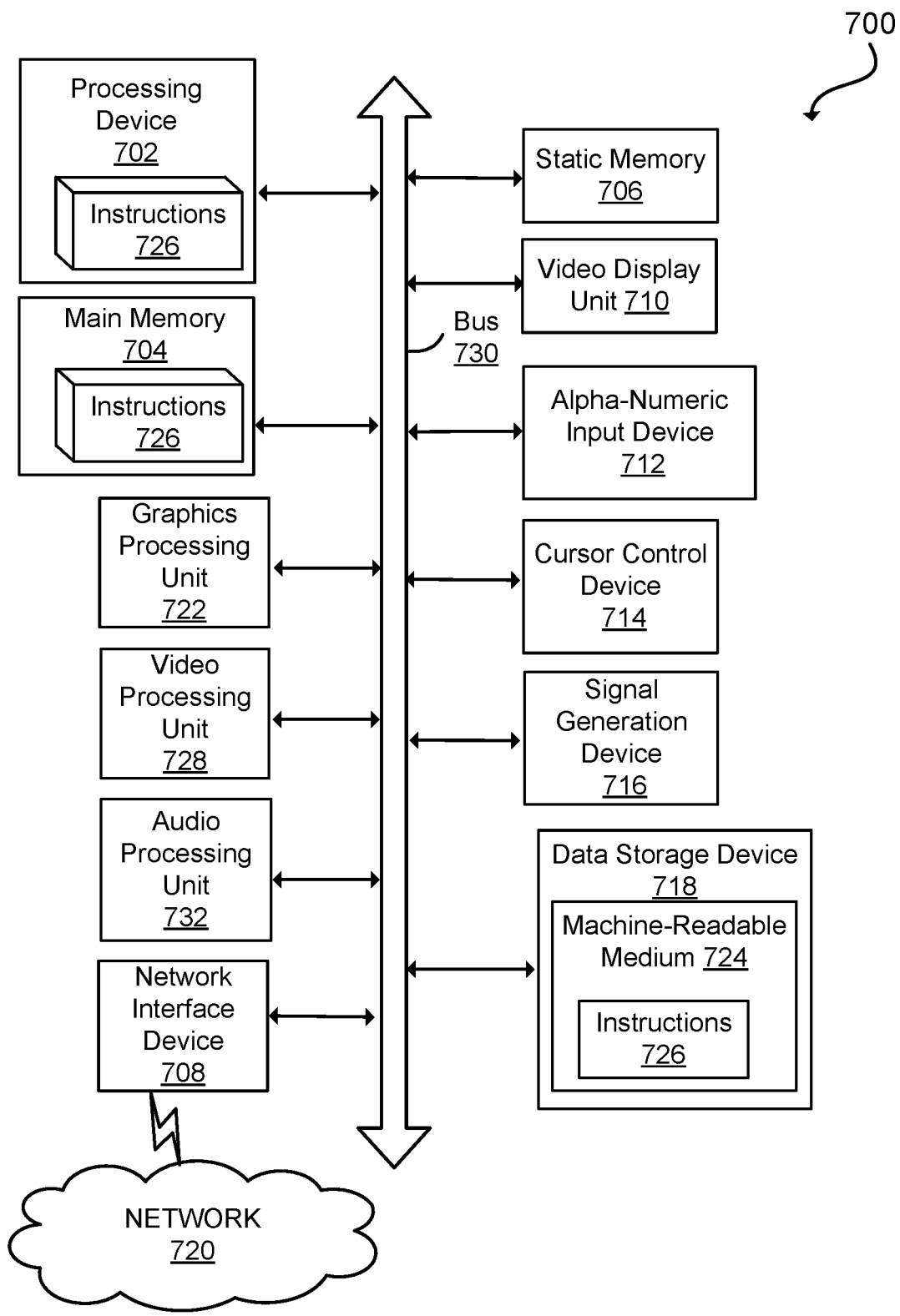
FIG. 7 depicts a diagram of an example computer system, in which embodiments of the present disclosure may operate.

FIG. 7 illustrates an example machine of a computer system 700 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM), a static memory 706 (e.g., flash memory, static random access memory (SRAM), etc.), and a data storage device 718, which communicate with each other via a bus 730.

Processing device 702 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 may also be one or more special-purpose processing devices such as an application specific integrated circuit (ASIC), a field programmable gate array (FPGA), a digital signal processor (DSP), network processor, or the like. The processing device 702 may be configured to execute instructions 726 for performing the operations and steps described herein.

The computer system 700 may further include a network interface device 708 to communicate over the network 720. The computer system 700 also may include a video display unit 710 (e.g., a liquid crystal display (LCD) or a cathode ray tube (CRT)), an alphanumeric input device 712 (e.g., a keyboard), a cursor control device 714 (e.g., a mouse), a graphics processing unit 722, a signal generation device 716 (e.g., a speaker), graphics processing unit 722, video processing unit 728, and audio processing unit 732.

The data storage device 718 may include a machine-readable storage medium 724 (also known as a non-transitory computer-readable medium) on which is stored one or more sets of instructions 726 or software embodying any one or more of the methodologies or functions described herein. The instructions 726 may also reside, completely or at least partially, within the main memory 704 and/or within the processing device 702 during execution thereof by the computer system 700, the main memory 704 and the processing device 702 also constituting machine-readable storage media.

In some implementations, the instructions 726 include instructions to implement functionality corresponding to the present disclosure. While the machine-readable storage medium 724 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 702 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. An integrated circuit comprising a configurable delay chain, the configurable delay chain comprising a chain of binary delay blocks, each binary delay block comprising:
   inputs that receive an input signal, a select signal and a test control signal;
   a delay branch that transmits the input signal with a delay, and a bypass branch that transmits the input signal without the delay;
   selector circuitry connected to the delay branch and to the bypass branch, wherein the selector circuitry selects either the delay branch or the bypass branch according to the select signal; and
   test circuitry that, according to the test control signal, produces a test signal to test the selector circuitry;
   wherein the binary delay blocks in the chain are physically laid out as a stack of binary delay blocks along a first direction, and the delay branches for the binary delay blocks include delay elements that are physically laid out along a second orthogonal direction, and a design for the stack of binary delay blocks is generated programmatically.

2. The integrated circuit of claim 1, wherein the delays for each binary delay block in the chain are binary weighted.

3. The integrated circuit of claim 1, further comprising: a single scan flop that provides the test control signal to the chain of binary delay blocks.

4. The integrated circuit of claim 1, wherein the selector circuitry is a multiplexer.

5. The integrated circuit of claim 1, wherein the input signal, the select signal and the test control signal is each a single bit signal.

6. The integrated circuit of claim 1, wherein the integrated circuit is physically laid out in rows, each binary delay block has a height of two rows, the selector circuitry and test circuitry comprise a header circuitry that is the same for the binary delay blocks and that is physically laid out to form a column of header circuitry, and the delay elements for the binary delay blocks are physically laid out as a loop that extends from the header circuitry along one of the two rows and returns back to the header circuitry along the other of the two rows.

7. The integrated circuit of claim 6, wherein the header circuitry includes a 2:1 multiplexer and two gates selected from a group consisting of two AND gates and two NAND gates.

8. The integrated circuit of claim 1, wherein the delay branches and bypass branches are balanced to have a same propagation delay, exclusive of the delays produced by the delay elements.

9. The integrated circuit of claim 1, wherein the integrated circuit is one of: a ring oscillator, a PUF (physically unclonable functions) circuit, a path margin monitor, and a PVT (process, voltage or temperature) monitor.

10. A method comprising:
asserting a test control signal to binary delay blocks, wherein each binary delay block includes selector circuitry that selects between a delay branch and a bypass branch according to a select signal, the binary delay blocks are chained to form a configurable delay chain, and the test control signal enables a test mode that tests operation of the selector circuitry, and asserting the test control signal causes the delay branch and the bypass branch to transmit different value signals to the selector circuitry;
during test mode, applying test patterns to the binary delay blocks, the test patterns including values of the select signal; and
observing an output of the selector circuitry in response to the test patterns to determine whether the selector circuitry is operating properly.

11. The method of claim 10, wherein the test control signal is asserted from a scan flop.

12. The method of claim 11, wherein multiple test patterns are applied to test the selector circuitry for all the binary delay blocks, and the test control signal remains asserted for all the test patterns.

13. The method of claim 10, wherein different test patterns test the selector circuitry in different binary delay blocks.

14. A non-transitory computer readable storage medium comprising a stored electronic representation of a binary delay block, the binary delay block comprising:
a first input that receives an input signal;
a delay branch and a bypass branch each connected to the first input, wherein the delay branch transmits the input signal with a delay and the bypass branch transmits the input signal without the delay;
a second input that receives a select bit;
selector circuitry connected to the second input and to the delay branch and the bypass branch, wherein the selector circuitry selects either the delay branch or the bypass branch according to the select bit;
a third input that receives a test control bit; and
test circuitry that causes the delay branch and the bypass branch to transmit different value signals to the selector circuitry when the test control bit is asserted;
wherein logic in the binary delay block consists of library circuit cells, the library circuit cells all have a height H, and the binary delay block has a height of 2H.

15. The non-transitory computer readable storage medium of claim 14, wherein the delay branches include chains of different numbers of delay elements, and the delay elements are all buffers or all inverters.

* * * * *